United States Patent
Li et al.

(10) Patent No.: US 11,296,525 B2
(45) Date of Patent: Apr. 5, 2022

(54) CONTROL DEVICE, ENERGY CONVERSION SYSTEM, ENERGY CONVERSION METHOD AND STORAGE MEDIUM

(71) Applicant: Contemporary Amperex Technology Co., Limited, Ningde (CN)

(72) Inventors: Meng Li, Ningde (CN); Zhimin Dan, Ningde (CN); Yizhen Hou, Ningde (CN)

(73) Assignee: Contemporary Amperex Technology Co., Limited, Ningde (CN)

( * ) Notice: Subject to any disclaimer, the term of this patent is extended or adjusted under 35 U.S.C. 154(b) by 0 days.

(21) Appl. No.: 15/733,803

(22) PCT Filed: Jun. 15, 2020

(86) PCT No.: PCT/CN2020/096062
§ 371 (c)(1),
(2) Date: Nov. 30, 2020

(65) Prior Publication Data
US 2021/0391736 A1    Dec. 16, 2021

(51) Int. Cl.
*H02J 7/00*    (2006.01)
*H01M 10/48*    (2006.01)
(Continued)

(52) U.S. Cl.
CPC ......... *H02J 7/0047* (2013.01); *H01M 10/052* (2013.01); *H01M 10/425* (2013.01);
(Continued)

(58) Field of Classification Search
CPC .... H02J 7/0047; H02J 7/00032; H02J 7/0029; H01M 10/052; H01M 10/425;
(Continued)

(56) References Cited

U.S. PATENT DOCUMENTS 7,075,311 B1    7/2006   Oshiro et al.
9,142,975 B2*    9/2015   Mori ..................... H02J 7/0068
(Continued)

FOREIGN PATENT DOCUMENTS

CN    103026577 A    4/2013
CN    103633708 A    3/2014
(Continued)

OTHER PUBLICATIONS

Written Opinion of the International Searching Authority issued in International Application No. PCT/CN2020/096062, dated Mar. 9, 2021, 9 pages.

*Primary Examiner* — Nathaniel R Pelton
(74) *Attorney, Agent, or Firm* — Sterne, Kessler, Goldstein & Fox P.L.L.C.

(57) ABSTRACT

The present disclosure provides a control device, an energy conversion system, an energy conversion method and a storage medium. The control device includes: a detection unit configured to detect a first voltage between a positive electrode of the energy storage device and a first end of an energy conversion device, a second voltage between a negative electrode of the energy storage device and a second end of the energy conversion device, and a third voltage between the positive electrode and the negative electrode of the energy storage device; a processing unit configured to calculate a resistance value corresponding to the energy conversion device according to the first voltage, the second voltage, and the third voltage; when the value of resistance is greater than a resistance threshold value, controlling the energy storage device to supply power to the electrical equipment through the energy conversion device.

20 Claims, 6 Drawing Sheets

(51) Int. Cl.
*H01M 10/44* (2006.01)
*H01M 10/052* (2010.01)
*H01M 10/42* (2006.01)

(52) U.S. Cl.
CPC ......... *H01M 10/441* (2013.01); *H01M 10/48* (2013.01); *H02J 7/0029* (2013.01); *H02J 7/00032* (2020.01); *H01M 2010/4271* (2013.01); *H01M 2010/4278* (2013.01)

(58) Field of Classification Search
CPC ............... H01M 10/441; H01M 10/48; H01M 2010/4271; H01M 2010/4278
USPC ........................................................ 320/134
See application file for complete search history.

(56) References Cited

U.S. PATENT DOCUMENTS

| | | |
|---|---|---|
| 2014/0021961 A1 | 1/2014 | Yamada et al. |
| 2015/0293167 A1 | 10/2015 | Kawamura |
| 2020/0052352 A1* | 2/2020 | Ham .................... H01M 50/20 |
| 2020/0110125 A1 | 4/2020 | Lehnhardt et al. |
| 2020/0386821 A1* | 12/2020 | Hong ...................... B60K 6/24 |

FOREIGN PATENT DOCUMENTS

| | | |
|---|---|---|
| CN | 110470983 A | 11/2019 |
| DE | 102009060662 A1 | 7/2011 |
| JP | 2013121256 A | 6/2013 |

\* cited by examiner

CONTROL DEVICE, ENERGY CONVERSION SYSTEM, ENERGY CONVERSION METHOD AND STORAGE MEDIUM

CROSS-REFERENCE TO RELATED APPLICATIONS

The present application is a U.S. National Stage Application under 35 U.S.C. § 371 of International Patent Application No. PCT/CN2020/096062, filed on Jun. 15, 2020, the disclosure of which is incorporated by reference herein in its entirety.

TECHNICAL FIELD

The present disclosure relates to the field of battery technologies, and in particular, to a control device, an energy conversion system, an energy conversion method, and a storage medium.

BACKGROUND

With the rapid development of electric automobile technology, the energy density of batteries is improved, the mileage that automobiles can drive is increased. More and more electric automobiles participate in the application of energy storage and power grid dispatching, realizing the effect of peak clipping and valley filling. Moreover, price difference subsidies can be given to automobile owners, reducing the cost of automobile purchasing, which promotes the development of electric automobiles and better protects the environment. The energy storage device of the electric automobile is a vehicle-mounted battery system, which can be a battery pack, a battery set or a battery core, and the energy storage device can release the electric energy of the battery pack through energy conversion device to provide electric energy for an electric appliance, or feed the electric energy to a power grid, and also can charge the battery pack through the energy conversion device. When the energy storage device provides electric energy for the electric appliance through the energy conversion device, the energy conversion device obtains the output electric energy of the energy storage device from a direct current bus of the electric automobile. However, the energy storage device cannot know the state of the external device, and if the corresponding relay on the direct current bus is directly closed and discharges outwards, the problem of short circuit of the energy storage device of the electric vehicle caused by short circuit of the external device can be caused.

SUMMARY

In view of the above, an object of the present disclosure is to provide a control device, an energy conversion system, an energy conversion method, and a storage medium.

According to a first aspect of the present disclosure, there is provided a control device comprising: a detection unit configured to detect a first voltage between a positive electrode of the energy storage device and a first end of an energy conversion device, a second voltage between a negative electrode of the energy storage device and a second end of the energy conversion device, and a third voltage between the positive electrode and the negative electrode of the energy storage device; and a processing unit configured to calculate a resistance value corresponding to the energy conversion device according to the first voltage, the second voltage, and the third voltage; and controlling the energy storage device to supply power to the electrical equipment through the energy conversion device in case that the value of resistance is greater than a resistance threshold value.

In some embodiments, the processing unit is further configured to prohibit the energy storage device from providing power to an electrical equipment through the energy conversion device in case that the resistance value is less than or equal to the resistance threshold value.

In some embodiments, the energy storage device is connected to the energy conversion device through a first connection line, in which a switch assembly is disposed; the processing unit is further configured to close the switch assembly to place the first connecting line in a closed state under the condition that the resistance value is greater than the resistance threshold value; and turn off the switch assembly under the condition that the resistance value is less than or equal to the resistance threshold value, to make the first connecting line be in a disconnected state.

In some embodiments, the detection unit comprises: a fault detection circuit connected to the first connecting line; in case that the first connecting line is in a disconnected state, the first connecting line and the fault detection circuit form a connection circuit between the energy storage device and the energy conversion device; the processing unit is further configured to calculate the resistance value from the first voltage, the second voltage, and the third voltage detected by the fault detection circuit and resistance information of the fault detection circuit.

In some embodiments, the first connecting line comprises: a first line for connecting the positive electrode of the energy storage device and the first end of the energy conversion device, and a second line for connecting the negative electrode of the energy storage device and the second end of the energy conversion device; the switch assembly comprises a first switch unit and a second switch unit which are respectively arranged on the first circuit and the second circuit; the fault detection circuit comprises: a first sampling circuit, a second sampling circuit and a third sampling circuit which are respectively connected with the first line and the second line; the first sampling circuit, the second sampling circuit and the third sampling circuit respectively detect a first voltage, a second voltage and a third voltage in case that the first switching unit and the second switching unit are in an off state.

In some embodiments, a connection point of the first end of the first sampling circuit and the first line is located between the first switch unit and the energy conversion device, and a connection point of the second end of the first sampling circuit and the second line is located between the second switch unit and the energy storage device; the first sampling circuit is configured to acquire a first sampling voltage through a first sampling point provided in the first sampling circuit; the connection point of the first end of the second sampling circuit and the first line is positioned between the first switch unit and the energy storage device, and the connection point of the second end of the second sampling circuit and the second line is positioned between the second switch unit and the energy conversion device; the second sampling circuit is configured to collect a second sampling voltage through a second sampling point provided in the second sampling circuit; the connection point of the first end of the third sampling circuit and the first line is positioned between the first switch unit and the energy storage device, and the connection point of the second end of the third sampling circuit and the second line is positioned between the second switch unit and the energy storage device; the third sampling circuit is configured to collect a third sampling voltage through a third sampling point provided in the third sampling circuit; and the processing unit is further configured to calculate a first voltage based on the first sampled voltage and resistance information of the first sampling circuit, calculate a second voltage based on the second sampled voltage and resistance information of the second sampling circuit, and calculate a third voltage based on the third sampled voltage and resistance information of the third sampling circuit.

In some embodiments, a first current collecting circuit configured to collect a first detected current value corresponding to a current transmitted through the first connection line, wherein the processing unit is further configured to acquire a first detected current value, a second detected current value corresponding to a current of the input or output energy conversion device after the control switch assembly is closed, and control the switch component to be in a closed state under the condition that the absolute value of the difference between the first detected current value and the second detected current value is smaller than a preset current difference value threshold value.

According to a second aspect of the present disclosure, there is provided an energy conversion system comprising: energy conversion device, energy storage device, any one of the aforementioned control devices.

In some embodiments, the energy conversion device comprises: a second current collecting unit configured to collect a second detected current value corresponding to a current of the input or output energy conversion device; and a communication module configured to transmit the second detected current value to a processing unit of the control device.

In some embodiments, the energy conversion device comprises: a second connecting line configured to receive the electric energy input by the energy storage device or output the electric energy to the energy storage device; an auxiliary power supply module; and a current limiting circuit arranged in the second connecting circuit and configured to limit the current transmitted from the second connecting circuit, so that the limited current input into the auxiliary power supply module to supply power for the energy conversion device.

In some embodiments, the current limiting circuit comprises: a current limiting resistor; and a third switching unit connected with the current limiting resistor in parallel, and be closed by the energy conversion device to carry out short circuit on the current limiting resistor in case that the energy conversion device is in a working state.

According to a third aspect of the present disclosure, there is provided an energy conversion method applied to an energy conversion system, the energy conversion system comprising: an energy conversion device, an energy storage device and a control device, wherein the control device comprises a detection unit and a processing unit; the detection unit is used for detecting a first voltage between the positive electrode of the energy storage device and the first end of the energy conversion device, a second voltage between the negative electrode of the energy storage device and the second end of the energy conversion device and a third voltage between the positive electrode and the negative electrode of the energy storage device; the energy conversion method is executed in a processing unit and comprises: calculating a resistance value corresponding to the energy conversion device according to the first voltage, the second voltage and the third voltage; and when the resistance value is greater than the resistance threshold value, controlling the energy storage device to supply power to the electrical equipment through the energy conversion device In some embodiments, when the resistance value is less than or equal to the resistance threshold value, the energy storage device is prohibited from supplying power to the electrical equipment through the energy conversion device.

In some embodiments, the energy storage device is connected to the energy conversion device through a first connection line, in which the switch assembly is disposed; when the resistance value is greater than the resistance threshold value, controlling the energy storage device to supply power to the electrical equipment through the energy conversion device comprises: when the resistance value is larger than the resistance threshold value, the switch assembly is closed so that the first connecting line is in a closed state; when the resistance value is less than or equal to the resistance threshold value, that prohibiting the energy storage device from supplying power to the electrical equipment through the energy conversion device comprises: when the resistance value is less than or equal to the resistance threshold value, turning off the switch component so that the first connecting circuit is in a disconnected state.

In some embodiments, the detection unit comprises: a fault detection circuit connected to the first connecting line; when the first connecting line is in a disconnected state, the first connecting line and the fault detection circuit form a connection circuit between the energy storage device and the energy conversion device; that calculating a resistance value corresponding to the energy conversion device according to the first voltage, the second voltage, and the third voltage comprises: calculating the resistance value according to the first voltage, the second voltage and the third voltage detected by the fault detection circuit and the resistance information of the fault detection circuit.

In some embodiments, the first connecting line comprises: a first line for connecting a positive electrode of the energy storage device and a first end of the energy conversion device, and a second line for connecting the positive electrode of the energy storage device and to second end of the energy conversion device; the switch assembly comprises a first switch unit and a second switch unit which are respectively arranged on the first line and the second line; the fault detection circuit comprises: a first sampling circuit, a second sampling circuit and a third sampling circuit which are respectively connected with the first line and the second line; and the energy conversion method further comprises:

when the first switch unit and the second switch unit are in a disconnected state, calculating a first voltage according to a first sampling voltage acquired by the first sampling circuit and resistance information of the first sampling circuit, calculating a second voltage according to a second sampling voltage acquired by the second sampling circuit and resistance information of the second sampling circuit, and calculating a third voltage according to a third sampling voltage acquired by the third sampling circuit and resistance information of the third sampling circuit.

In some embodiments, the control device further comprises: a first current collecting circuit configured to collect a first detected current value corresponding to a current transmitted through the first connection line; the energy conversion method further comprises: after the control switch assembly is closed, acquiring a first detected current value and a second detected current value corresponding to the current input into the energy conversion device or the current output by the energy conversion device; and controlling the switch assembly to be in a closed state under the condition that the absolute value of the difference between the first detected current value and the second detected current value is smaller than a preset current difference value threshold value.

In some embodiments, the energy conversion device comprises a second connecting line, an auxiliary power module, and a current limiting circuit; the second connecting line is configured to receive the electric energy input by the energy storage device or output the electric energy to the energy storage device; and the current limiting circuit is arranged in the second connecting line; the current limiting circuit limits current passing through the second connecting circuit, so that the current limited is input into the auxiliary power supply module to supply power for the energy conversion device.

In some embodiments, the current limiting circuit comprises: a current limiting resistor and a third switch unit; the third switch unit is connected in parallel with the current limiting resistor; and the method comprises: when the energy conversion device is in the working state, the energy conversion device closes the third switch unit to short-circuit the current limiting resistor.

According to a fourth aspect of the present disclosure, there is provided a computer-readable storage medium having stored thereon computer program instructions which, when executed by one or more processors, implement the steps of the method as described above.

BRIEF DESCRIPTION OF THE DRAWINGS

In order to more clearly illustrate the embodiments of the present disclosure or technical solutions in related arts, the drawings used in the description of the embodiments or related arts will be briefly described below, it is obvious that the drawings in the description below are only some embodiments of the present disclosure, and for those skilled in the art, other drawings may be obtained according to the drawings without creative efforts.

DETAILED DESCRIPTION

The present disclosure now will be described more fully hereinafter with reference to the accompanying drawings, in which exemplary embodiments of the disclosure are shown. The technical solutions in the embodiments of the present disclosure will be described clearly and completely with reference to the drawings in the embodiments of the present disclosure, and it is obvious that the embodiments described are only some embodiments of the present disclosure, rather than all embodiments. All other embodiments, which can be derived by a person skilled in the art from the embodiments disclosed herein without making any creative effort, shall fall within the protection scope of the present disclosure. The technical solution of the present disclosure is variously described below with reference to various drawings and embodiments.

The terms "first", "second", and the like, hereinafter, are used only for descriptive distinction and have no other special meanings.

Figure 1:
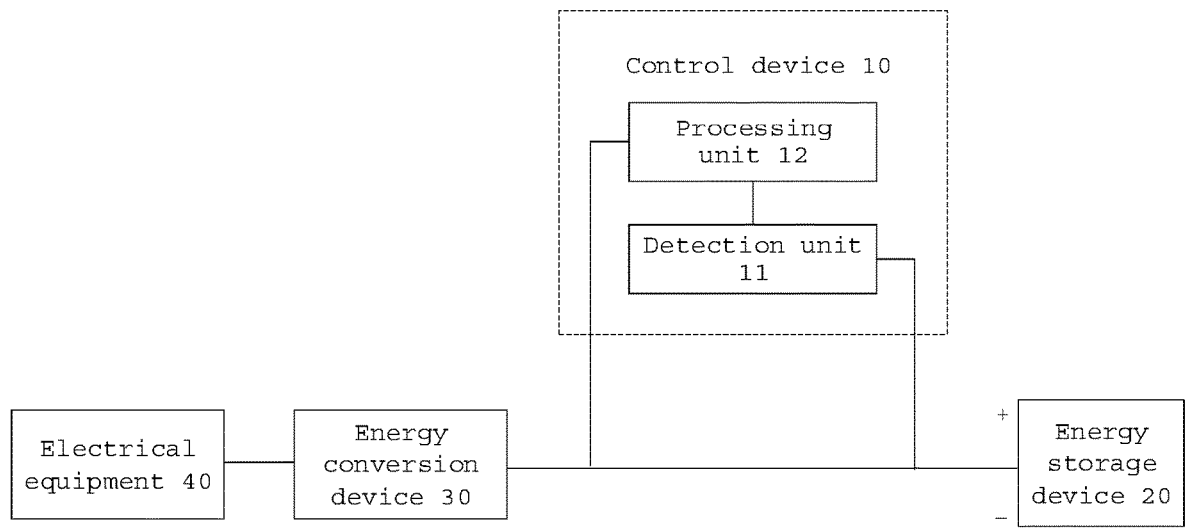
FIG. 1 is a first schematic structural diagram of some embodiments of a control device of the present disclosure.

In some embodiments, as shown in FIG. 1, the present disclosure provides a control device 10 comprising a detection unit 11 and a processing unit 12. Energy storage device 20 may be a vehicle-mounted battery system. For example, energy storage device 20 is a vehicle-mounted power battery system of an electric vehicle. The vehicle-mounted battery system of the electric vehicle includes a battery pack, a battery set or a battery cell, and the battery pack may be a lithium battery pack.

The energy conversion device 30 may be a device supporting bidirectional charging and discharging, and performs conversion processing, such as voltage transformation and current transformation, on the electric energy input or output to the energy storage device 20. Energy conversion device 30 may be a portable energy conversion device or the like, with energy conversion device 30 itself not carrying electrical energy. The power grid may charge energy storage device 20 through energy conversion device 30, and may also enable energy storage device 20 to provide electric energy for electrical apparatus 40 through energy conversion device 30, or feed back the electric energy of energy storage device 20 to the power grid through energy conversion device 30, where electrical apparatus 40 may be various household appliances, and the like.

The detection unit 11 may include various detection circuits for detecting a first voltage between a positive electrode of the energy storage device 20 and a first end of the energy conversion device 30, a second voltage between a negative electrode of the energy storage device 20 and a second end of the energy conversion device 30, and a third voltage between the positive electrode of the energy storage device 20 and the negative electrode of the energy storage device 20.

The processing unit 12 may be implemented as an independent component, or integrated with a BMS (Battery Management System), or integrated with the energy conversion device 30. The processing unit 12 calculates a resistance value corresponding to the energy conversion device 30 from the first voltage, the second voltage, and the third voltage. When the resistance value is greater than the resistance threshold value, the processing unit 12 controls the energy storage device 20 to supply power to the electrical equipment 40 through the energy conversion device 30; when the resistance value is greater than the resistance threshold value, the processing unit 12 may also control the energy storage device 20 to perform energy conversion with the power grid through the energy conversion device 30, where the power grid charges the energy storage device 20 through the energy conversion device 30, or the energy storage device 20 feeds power to the power grid through the energy conversion device 30; when the resistance value is less than or equal to the resistance threshold value, the processing unit 12 prohibits the energy storage device 20 from supplying power to the electrical equipment 40 through the energy conversion device 30, and the processing unit 12 may also prohibit the energy storage device 20 from performing energy conversion to the power grid through the energy conversion device 30.

The resistance threshold is a threshold set for determining whether the energy conversion device 30 is short-circuited, and the magnitude of the resistance threshold may be selected according to specific types of the energy conversion device 30 and the electrical device 40.

Figure 2:
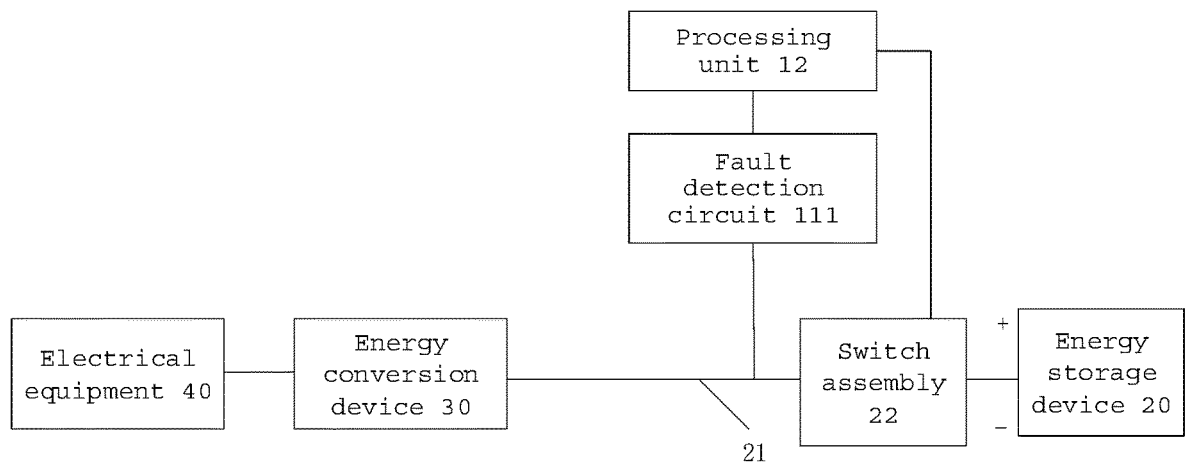
FIG. 2 is a second schematic structural diagram of some embodiments of the control device of the present disclosure.

In some embodiments, as shown in FIG. 2, the energy storage device 20 is connected to the energy conversion device 30 via a first connecting line 21, a switch assembly 22 is provided in the first connecting line 21, and first connecting line 21 may be a DC bus of the energy storage device 20, or the like.

Under the condition that the resistance value corresponding to the energy conversion device 30 is greater than the resistance threshold value, the processing unit 12 controls the switch assembly 22 to close, and controls the energy storage device 20 to supply power to the electrical equipment 40 through the energy conversion device 30.

Under the condition that the resistance value corresponding to the energy conversion device 30 is less than or equal to the resistance threshold value, the processing unit 12 controls the switch assembly 22 to be disconnected, so that the energy storage device 20 is disconnected from the energy conversion device 30, and may send a warning message of prohibiting charging and discharging to the whole vehicle control unit to prompt the user to perform corresponding processing, so as to effectively protect the energy storage device 20 and avoid short circuit of the energy storage device 20 due to short circuit of an external device.

In some embodiments, the detection unit 11 comprises a failure detection circuit 111, the failure detection circuit 111 being connected to the first connection line 21. The processing unit 12 controls the switch assembly 22 to be disconnected, and in a state where the first connecting line 21 is in a disconnected state, the first connecting line 21 and fault detection circuit 111 form a connection circuit between energy storage device 20 and energy conversion device 30, and the first voltage, the second voltage, and the third voltage are detected by fault detection circuit 111.

The processing unit 12 calculates a resistance value corresponding to the energy conversion device 30 according to the first voltage, the second voltage, and the third voltage detected by the fault detection circuit 111 and the resistance information corresponding to the fault detection circuit 111, and controls the switching operation of the switch assembly 22 according to the resistance value to control the energy storage device 20 to be disconnected or connected to the energy conversion device 30.

For example, the energy storage device 20 is a vehicle-mounted battery system of an electric vehicle, and the energy storage device 20 may provide electric energy to an external electrical device 40 through the energy conversion device 30 or feed back the electric energy to the power grid, or may be charged through the energy conversion device 30. In a state where the energy conversion device 30 is connected to the first connecting line 21, and the processing unit 12 controls the switch assembly 22 in the first connection line 21 to be in a disconnected state, the first voltage, the second voltage, and the third voltage are detected by the fault detection circuit 111.

The processing unit 12 calculates a resistance value corresponding to the energy conversion device 30 from the first voltage, the second voltage, and the third voltage, and the resistance information corresponding to the fault detection circuit 111. The processing unit 12 determines whether a short circuit condition exists in the energy conversion device 30 by determining whether the resistance value is greater than a preset resistance threshold value.

If a short circuit condition exists with energy conversion device 30, processing unit 12 controls switch assembly 22 to be disconnected; if there is no short circuit condition with energy conversion device 30, the processing unit 12 controls the switch assembly 22 to be in communication, such that energy storage device 20 is in communication with energy conversion device 30, and energy storage device 20 performs discharging or charging through energy conversion device 30.

The control device can provide a connection circuit between the energy storage device and the energy conversion device through the fault detection circuit and the first connecting line when the energy storage device is connected with the energy conversion device and the first connection circuit is in a disconnected state, and can obtain the resistance value corresponding to the energy conversion device by using the electric energy of the energy storage device and the fault detection circuit, and the energy storage device is controlled to be disconnected or communicated with the energy conversion device according to the resistance value, so as to avoid the problem that the energy storage device is short-circuited due to short-circuit faults of external devices, thereby protecting the energy storage device, and improving the safety and the reliability of charging and discharging of the energy storage device. Moreover, the fault detection circuit is directly connected to the first connection circuit, so that an additional detection device is not needed, and the problems of inconvenient operation, potential safety hazards and the like caused by detection operation by using an external detection device under the condition that the energy storage device is connected with the energy conversion device are avoided.

Figure 3:
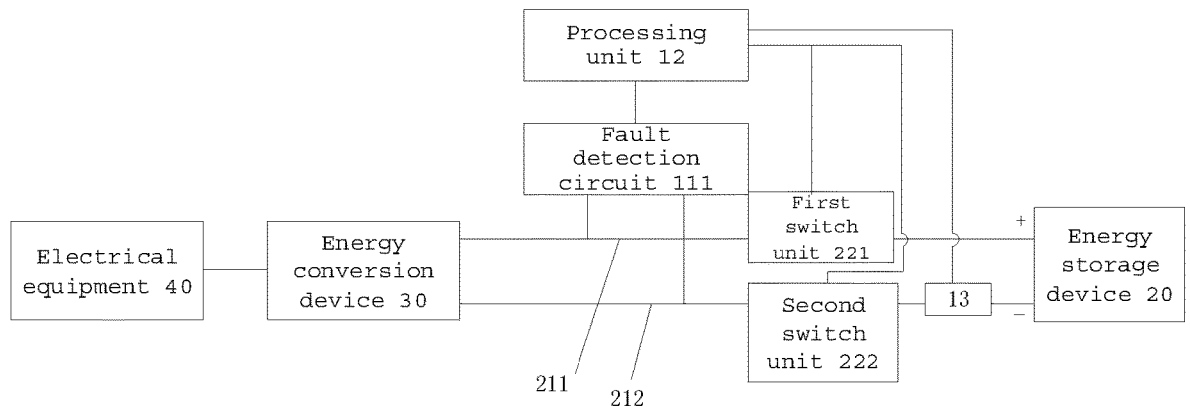
FIG. 3 is a third schematic structural diagram of some embodiments of the control device of the present disclosure.

In some embodiments, as shown in FIG. 3, the first connecting line 21 includes a first line 211 for connecting the positive electrode of the energy storage device 20 and a first end of energy conversion device 30, and a second line 212 for connecting the negative electrode of energy storage device 20 and a second end of energy conversion device 30. The switch assembly 22 includes a first switch unit 221 and a second switch unit 222 provided in the first line 211 and the second line 212, respectively. The first switch unit 221 and the second switch unit 222 may be various kinds of electric switches, relays, and the like. The fault detection circuit 111 is connected to the first line 211 and the second line 212, respectively. The control unit 12 controls the opening or closing of the first switch unit 221 and the second switch unit 222.

Figure 4:
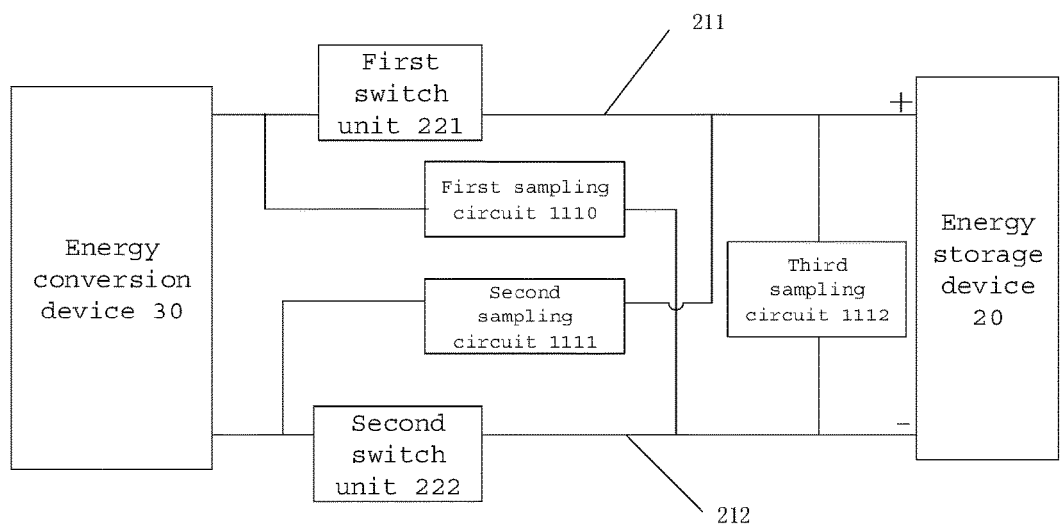
FIG. 4 is a first schematic structural diagram of a fault detection circuit in some embodiments of the control device of the present disclosure.

In some embodiments, as shown in FIG. 4, the fault detection circuit 111 includes a first sampling circuit 1110, a second sampling circuit 1111, and a third sampling circuit 1112. In a state where the first switch unit 221 and the second switch unit 222 are disconnected, the first sampling circuit 1110, the second sampling circuit 1111, and the third sampling circuit 1112 detect the first, second, and third voltages, respectively.

A connection point of a first end of the first sampling circuit 1110 and the first line 211 is located between the first switching unit 221 and the energy conversion device 30, and a connection point of a second end and the second line 212 is located between the second switching unit 222 and the energy storage device 20, and a first sampling voltage is acquired through a first sampling point provided in the first sampling circuit 1110. The processing unit 12 calculates the first voltage based on the first sampling voltage and the resistance information of the first sampling circuit 1110.

A connection point of a first end of the second sampling circuit 1111 and the first line 211 is located between the first switch unit 221 and the energy storage device 20, a connection point of a second end and the second line 212 is located between the second switch unit 222 and the energy conversion device 30, and a second sampling voltage is acquired through a second sampling point provided in the second sampling circuit 1111; the processing unit 12 calculates the second voltage based on the second sampling voltage and the resistance information of the second sampling circuit 1111.

A connection point of a first end of the third sampling circuit 1112 and the first line 211 is located between the first switch unit 221 and the energy storage device 20, a connection point of a second end and the second line 212 is located between the second switch unit 222 and the energy storage device 20, and a third sampling voltage is acquired through a third sampling point arranged in the third sampling circuit 1112; the processing unit 12 calculates the third voltage based on the third sampling voltage and the resistance information of the third sampling circuit 1112.

Figure 5A:
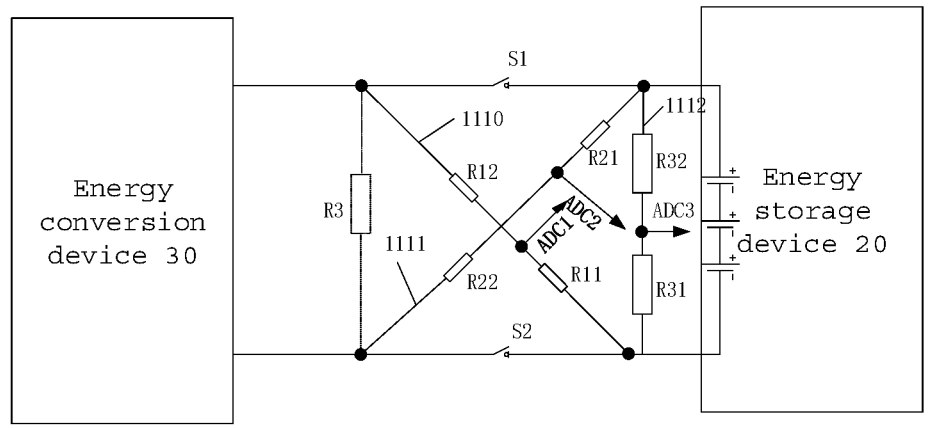
FIG. 5A is a second schematic structural diagram of a fault detection circuit in some embodiments of the control device of the present disclosure.

In some embodiments, as shown in FIG. 5A, the first switch unit is S1 and the second switch unit is S2. The first sampling circuit 1110 includes resistors R11 and R12, and the second sampling circuit 1111 includes resistors R21 and R22, and the third sampling circuit 1112 includes resistors R31 and R32. The resistances of the resistors in the first sampling circuit 1110, the second sampling circuit 1111, and the third sampling circuit 1112 are relatively large, and generally range from 0.1 megaohm to 10 megaohms.

The first sampling point is ADC1, and the first sampling voltage is U1; the second sampling point is ADC2, and the second sampling voltage is U2; the third sampling point is ADC3, and the third sampling voltage is U3. The impedance corresponding to the energy conversion device 30 is R3, which can be obtained by calculation.

The outer side of the first switch unit S1 refers to a side of the first switch unit S1 close to the energy conversion device 30, and the inner side of the first switch unit S1 refers to a side of the first switch unit S1 close to the energy storage device 20; the outside of the second switch unit S2 refers to a side of the second switch unit S2 close to the energy conversion device 30; the inside of the second switching unit S2 refers to a side of the second switch unit S2 close to the energy storage device 20. Ubat1 is the voltage between the outer side of the first switch unit S1 and the positive electrode of the energy storage device 20, Ubat2 is the voltage between the outer side of the second switch unit S2 and the positive electrode of the energy storage device 20, Ubat3 is the voltage between the positive electrode and the negative electrode of the energy storage device 20, and Ubat4 is the voltage across the energy conversion device 30, and the specific calculation formula is as follows:

$$Ubat1 = \frac{U1}{R11} * (R11 + R12); \quad (1\text{-}1)$$

$$Ubat2 = \frac{U2}{R21} * (R21 + R22); \quad (1\text{-}2)$$

$$Ubat3 = \frac{U3}{R31} * (R31 + R32); \quad (1\text{-}3)$$

$$Ubat4 = Ubat3 - Ubat2 - Ubat1; \quad (1\text{-}4)$$

$$\frac{Ubat4}{R3} = \frac{Ubat1}{R11 + R12}; \quad (1\text{-}5)$$

The following formula can be obtained from formulas (1-1), (1-2), (1-3), (1-4) and (1-5):

$$R3 = \frac{\left(\frac{U3}{R31}*(R31+R32) - \frac{U2}{R21}*(R21+R22) - \frac{U1}{R11}*(R11+R12)\right)*(R11+R12)}{\frac{U1}{R11}*(R11+R12)}; \quad (1\text{-}6)$$

Wherein the processing unit 12 may calculate the value of R3 according to the formula (1-6), and if the value of R3 is less than or equal to the preset resistance threshold, it is determined that the short circuit condition occurs in the energy conversion device 30, and controls S1 and S2 are in a disconnected state; if R3 is greater than the preset resistance threshold, it is determined that energy conversion device 30 is normal, and processing unit 12 controls S1 and S2 to close, so that energy storage device 20 outputs electrical energy to energy conversion device 30.

The processing unit 12 may calculate the first voltage, the second voltage and the third voltage based on the fault detection circuit 111 and calculate a resistance value corresponding to the energy conversion device according to the first voltage, the second voltage and the third voltage to determine whether there is a fault in the energy conversion device, and the processing unit 12 may further determine whether there is an abnormality in the switch in the circuit based on the voltage collected by the fault detection circuit, for example, by comparing Ubat1 with Ubat3, and if the difference is smaller than a preset voltage threshold, it is determined that S1 is stuck, and by comparing Ubat2 with Ubat3, if the difference is smaller than the preset voltage threshold, it is determined that S2 is stuck.

In some embodiments, the first sampling circuit, the second sampling circuit, and the third sampling circuit in the fault detection circuit 111 may be implemented in various ways. It will be understood by those skilled in the art that the first sampling circuit, the second sampling circuit and the third sampling circuit may be arranged in a manner of setting a reference ground point, all of which may obtain the first voltage, the second voltage and the third voltage. The processing unit 12 calculates a resistance value corresponding to the energy conversion device 30 from the first voltage, the second voltage, and the third voltage, and the resistance information corresponding to the fault detection circuit 111.

Figure 5B:
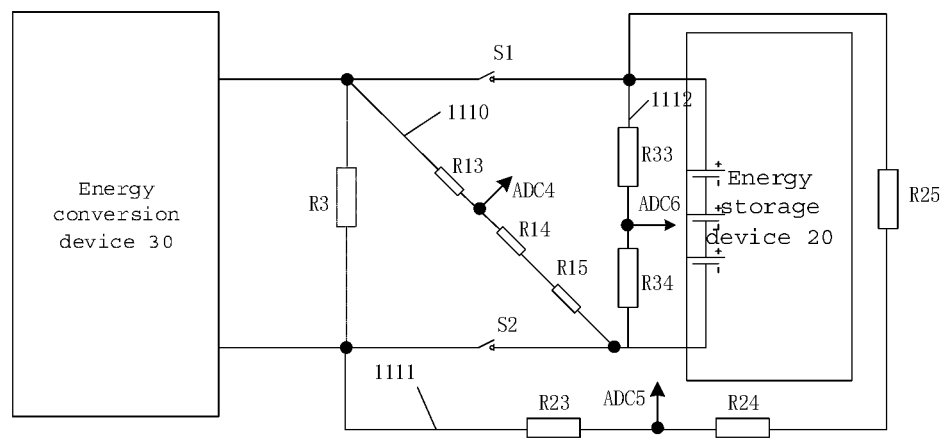
FIG. 5B is a third schematic structural diagram of a fault detection circuit in some embodiments of the control device of the present disclosure.

For example, as shown in FIG. 5B, the first sampling circuit 1110 of the fault detection circuit 111 includes resistors R13, R14, and R15, the second sampling circuit 1111 includes resistors R23, R24, and R25, and the third sampling circuit 1112 includes resistors R33 and R34. The resistances of the resistors in the first sampling circuit 1110, the second sampling circuit 1111, and the third sampling circuit 1112 are relatively large, and generally range from 0.1 megaohm to 10 megaohms. The first sampling point is ADC4, and the first sampling voltage is U4; the second sampling point is ADC5, and the second sampling voltage is U5; the third sampling point is ADC6, and the third sampling voltage is U6. The above-described first voltage, second voltage, and third voltage can be obtained based on the same principle, and the processing unit 12 calculates the resistance value corresponding to the energy conversion device 30 from the first voltage, second voltage, and third voltage, and the resistance information corresponding to the first sampling circuit 1110, the second sampling circuit 1111, and the third sampling circuit 1112.

In some embodiments, as shown in FIG. 3, the control device of the present disclosure may further include a first current collecting circuit 13 which may be of different types, such as a collecting circuit including a hall current sensor and the like. The first current collecting circuit 13 may be provided in the first line 211 or the second line 212, and collects a first detecting current value corresponding to the current transmitted through the first line 211 or the second line 212.

The processing unit 12, after controlling the first switch unit 221 and the second switch unit 222 to be closed, acquires a first detected current value acquired by the first current collecting circuit 13, and collects a second detected current value corresponding to the current input to the energy conversion device 30 or output from the energy conversion device 30, determines whether an abnormality occurs based on the first detected current value and the second detected current value, and performs a corresponding operation.

There are various ways of determining the occurrence of an abnormality. For example, the processing unit 12 determines that charging or discharging is abnormal and performs a corresponding operation on the condition that the absolute value of the difference between the first detected current value and the second detected current value is greater than a preset difference threshold value. The difference threshold may be set according to a specific application scenario, and may be a value close to 0.

For example, after the processing unit 12 controls the first switch unit 221 and the second switch unit 222 to be closed, it is determined whether the absolute value of the difference between the first detected current value and the second detected current value is greater than the difference threshold value; if the absolute value is less than or equal to the difference threshold value, the first detected current value and the second detected current value are basically the same, and the working state is a normal state; if the absolute value is larger than the difference threshold, the difference between the first detected current value and the second detected current value is larger, and the working state is an abnormal state.

The operation corresponding to the abnormal state may be to send an alarm message to notify the user to check the acquisition circuit, the device, and the like for acquiring the first detected current value and the second detected current value, and the like, and the current acquisition by the first current acquisition circuit 13 may be used to check the acquisition circuit, the device, and the like, and further confirm whether the energy conversion device and the circuit have faults, thereby improving reliability.

Figure 6:
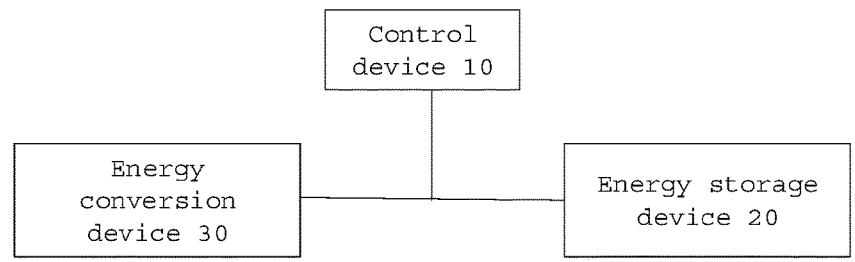
FIG. 6 is a first schematic structural diagram of some embodiments of an energy conversion system of the present disclosure.

As shown in FIG. 6, the present disclosure provides an energy conversion system comprising an energy storage device 20, an energy conversion device 30, and a control apparatus 10 as in any of the above embodiments.

Figure 7:
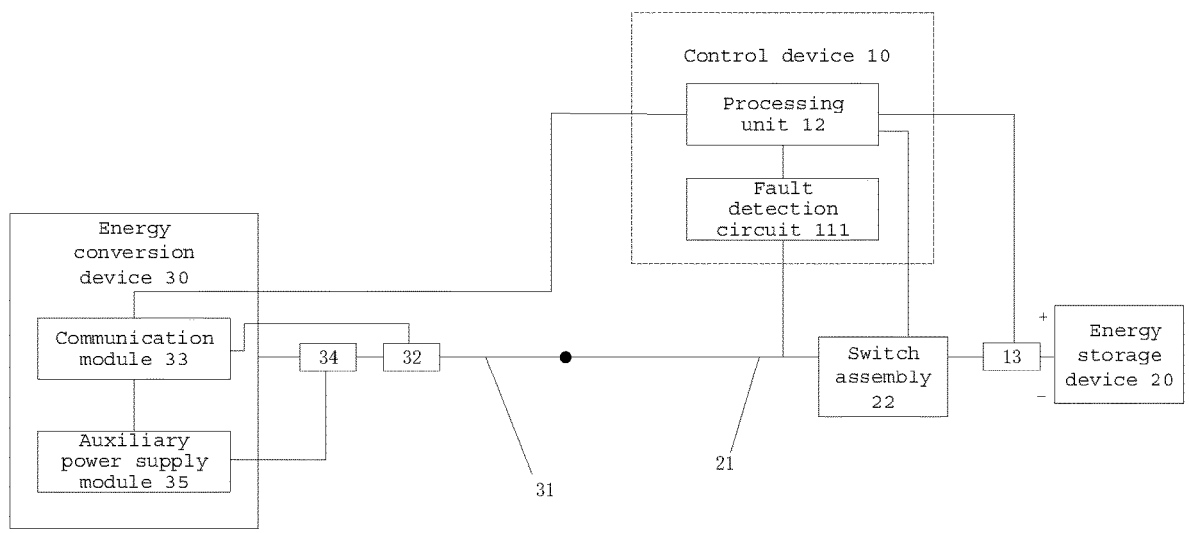
FIG. 7 is a second schematic structural diagram of some embodiments of the energy conversion system of the present disclosure.

In some embodiments, as shown in FIG. 7, the energy conversion device 30 comprises a second connecting line 31, a second current collection unit 32 and a communication module 33. The second connection line 31 is connected to the first connecting line 21, and the second connection line 31 receives the electric energy output from the energy storage device 20 through the first connecting line 21, or outputs the electric energy of a power grid or the like to the energy storage device 20 through the first connecting line 21.

The second current collection unit 32 is configured to collect a second detected current value corresponding to a current input to or output from the energy conversion device 30. A second current collection unit 32 may be provided in the second connection line 31 to collect a second detected current value. The second current collection unit 32 may be of different types, such as a collecting circuit including a hall current sensor, and the like. The communication module 33 acquires the second detected current value acquired by the second current collection unit 32, and transmits the second detected current value to the processing unit of the control device 10. The communication module 33 may communicate with the processing unit 12 in a variety of ways, such as using CAN bus communication or the like.

Energy conversion device 30 includes an auxiliary power supply module 35 and a current limiting circuit 34. The energy conversion device 30 does not have electrical energy of its own, and needs to obtain external electrical energy to supply power to the energy conversion device 30 thereby to operate energy conversion device 30. The current limiting circuit 34 is disposed in the second connection line 31, and the current limiting circuit 34 limits the current input through the second connection line 31, so that the limited current is input to the auxiliary power supply module 35 to supply power to the communication module 33 and the like, so as to operate the energy conversion device 30. The current limiting circuit 34 limits the current, thereby avoiding a short circuit of energy storage device 20 due to a short circuit of an external device such as energy conversion device 30.

Figure 8:
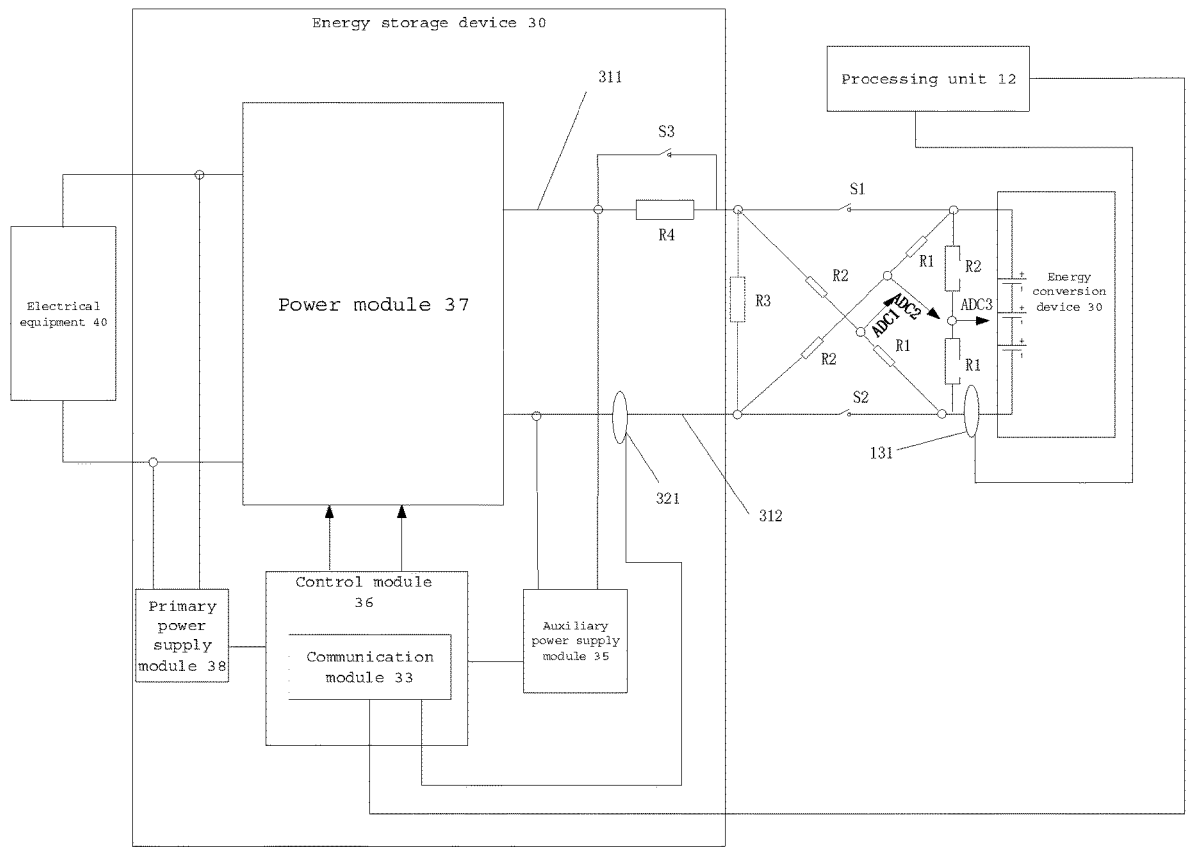
FIG. 8 is a third schematic structural view of some embodiments of the energy conversion system of the present disclosure.

In some embodiments, as shown in FIG. 8, the current limiting circuit includes a current limiting resistor R4. The second connection line 31 includes a third line 311 and a fourth line 312 for communicating with the positive electrode and the negative electrode of the energy storage device 30, respectively, and a current limiting resistor R4 is provided in the third line 311. The power conversion device 30 includes a third switching unit S3 connected in parallel with a current limiting resistor R4.

When the processing unit 12 controls S1 and S2 to be closed, the current limiting circuit R4 limits the current input to the auxiliary power supply module 35, so that the current input to the auxiliary power supply module 35 can be reduced, and damage to components of the energy conversion device 30 due to an excessive current can be avoided when power supply starts, thereby achieving a protection effect. After the energy conversion device 30 is in the working state, the third switching unit S3 is closed to short-circuit the current-limiting resistor R4, so as to reduce the power consumed by R4.

The energy conversion device 30 also includes a control module 36, a power module 37, and a primary power supply module 38. Neither the primary power supply module 38 nor the auxiliary power supply module 35 has electric power by itself, and the energy conversion device 30 is supplied with electric power input from the outside. The power module 37 converts the current input by the energy storage device 20 and provides the converted current to the electrical equipment 40, or the power module 37 converts the current input by the external network and provides the converted current to the energy storage device 20. The control module 36 is used to control the power module 37 and the like, and the control module 36 may be integrated with the communication module 33.

When the processing unit 12 determines that the resistance value corresponding to the energy conversion device 30 is greater than the resistance threshold value, that is, when the resistance value is a safety value, S1 and S2 are directly closed, and R4 limits the current input to the auxiliary power supply module 35; for the auxiliary power supply module 35, the operating voltage range is: Umin-Umax, if the maximum operating current of the auxiliary power supply module 35 is I1, then the following requirements are made for the choice of R4:

$$Ubatmin - I1 * R4 > Umin; \qquad (1\text{-}7)$$

$$R4 > \frac{Umax^2}{P}; \qquad (1\text{-}8)$$

By simultaneous equations (1-7) and (1-8), it can be calculated that:

$$\frac{Umax^2}{P} < R4 < \frac{Ubatmin - Umin}{I1}; \qquad (1\text{-}9)$$

where P is the maximum heating power that the resistor R4 can withstand, Ubatmin is the lowest voltage that the energy storage device 20 (battery pack) can support the discharge mode, and for safety, R4 should be under the condition of formula (1-9), and the larger the selected resistance value is, the better the resistance value is.

After the auxiliary power supply module 35 is in the operating state, S3 is closed, and the control module 36 and the power module 37 are operated. The first current collecting circuit includes a hall current sensor 131, and the second current collection unit includes a hall current sensor 321. The communication module 33 transmits the second detected current value acquired by the hall current sensor 321 to the processing unit 12 through a communication method such as a CAN bus.

The processing unit 12 obtains a first detected current value collected by the hall current sensor 131, and receives a second detected current value sent by the communication module 33. The processing unit 12 determines that an abnormality occurs and sends warning information when the absolute value of the difference between the first detected current value and the second detected current value is greater than a preset difference threshold value, prompts a user to check the working states of the energy conversion device 30 and the energy storage device 20, can realize checking of the acquisition circuit, the device and the like, and further confirms whether the charging and discharging circuit is abnormal, thereby improving reliability.

Figure 9:
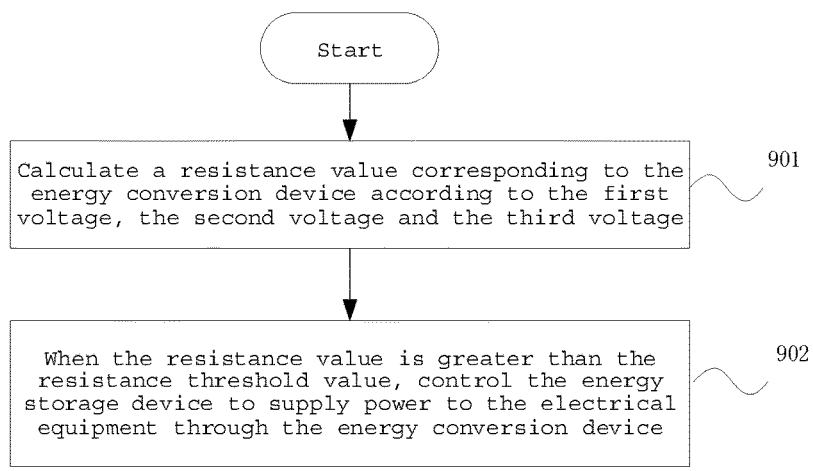
FIG. 9 is a schematic flow diagram of some embodiments of an energy conversion method of the present disclosure.

In some embodiments, the present disclosure provides an energy conversion method applied to the energy conversion system according to any one of the above embodiments, where the energy conversion system includes an energy conversion device, an energy storage device, and a control device, and the control device includes a detection unit and a processing unit; the detection unit is used for detecting a first voltage between the positive electrode of the energy storage device and the first end of the energy conversion device, a second voltage between the negative electrode of the energy storage device and the second end of the energy conversion device and a third voltage between the positive electrode of the energy storage device and the negative electrode of the energy storage device; the energy conversion method is executed in the processing unit. FIG. 9 is a schematic flow diagram of some embodiments of the energy conversion method of the present disclosure, as shown in FIG. 9:

step 901, calculating a resistance value corresponding to the energy conversion device according to the first voltage, the second voltage and the third voltage.

And 902, when the resistance value is greater than the resistance threshold value, the energy storage device is controlled to supply power to the electrical equipment through the energy conversion device.

Figure 10:
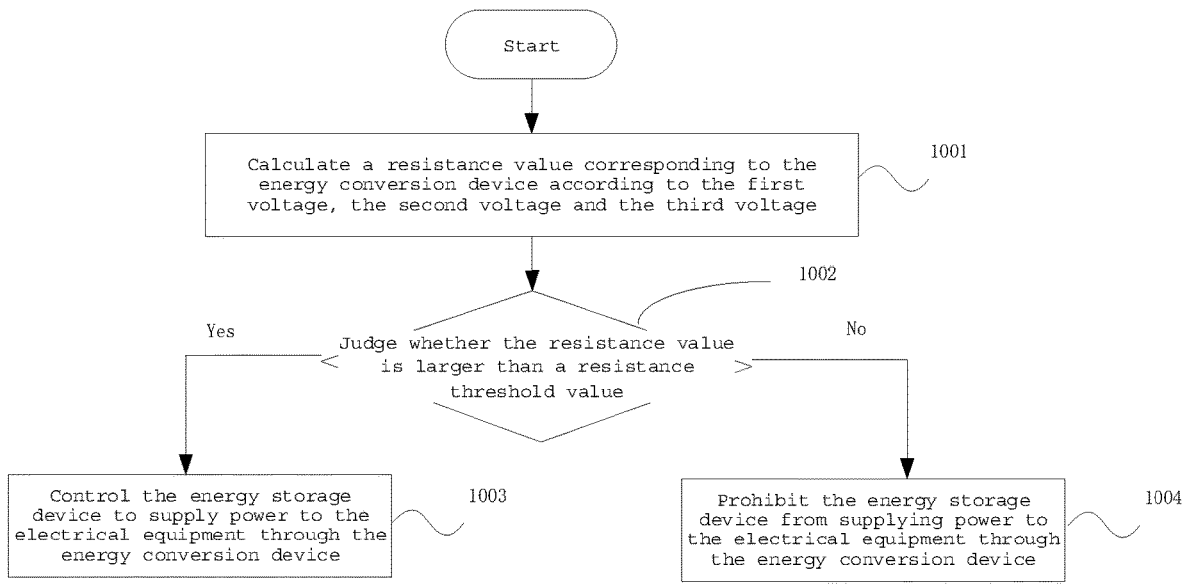
FIG. 10 is a schematic flow diagram of further embodiments of the energy conversion method of the present disclosure.

FIG. 10 is a schematic flow diagram of another embodiment of the energy conversion method of the present disclosure, as shown in FIG. 10:

At step 1001, a resistance value corresponding to the energy conversion device is calculated according to the first voltage, the second voltage and the third voltage.

At step 1002, judging whether the resistance value is larger than a resistance threshold value, if so, entering step 1003, and if not, entering step 1004.

At step 1003, the energy storage device is controlled to supply power to the electrical equipment through the energy conversion device. The method can also comprise the step of controlling the energy storage device to perform energy conversion with the power grid through the energy conversion device.

At 1004, the energy storage device is prohibited from supplying power to the electrical equipment through the energy conversion device. The method may further comprise prohibiting the energy storage device from performing energy conversion with the power grid via the energy conversion device.

The energy storage device is connected with the energy conversion device through a first connecting line, and a switch assembly is arranged in the first connecting line. The processing unit further performs: when the resistance value is larger than the resistance threshold value, the switch assembly is closed so that the first connecting circuit is in a closed state; and when the resistance value is less than or equal to the resistance threshold value, the switch component is turned off so that the first connecting circuit is in a disconnected state.

The detection unit comprises a fault detection circuit which is connected with the first connecting line; when the first connecting line is in a disconnected state, the first connecting line and the fault detection circuit form a connection circuit between the energy storage device and the energy conversion device; the processing unit further performs: calculating a resistance value according to the first voltage, the second voltage and the third voltage detected by the fault detection circuit and the resistance information of the fault detection circuit.

The first connecting line comprises a first line for connecting a positive electrode of the energy storage device and a first end of the energy conversion device and a second line for connecting the positive electrode of the energy storage device and a second end of the energy conversion device; the switch assembly comprises a first switch unit and a second switch unit which are respectively arranged on the first circuit and the second circuit; the fault detection circuit includes: the first sampling circuit, the second sampling circuit and the third sampling circuit which are respectively connected with the first line and the second line; the processing unit further performs: when the first switch unit and the second switch unit are in a disconnected state, calculating a first voltage according to a first sampling voltage acquired by the first sampling circuit and resistance information of the first sampling circuit, calculating a second voltage according to a second sampling voltage acquired by the second sampling circuit and resistance information of the second sampling circuit, and calculating a third voltage according to a third sampling voltage acquired by the third sampling circuit and resistance information of the third sampling circuit.

Figure 11:
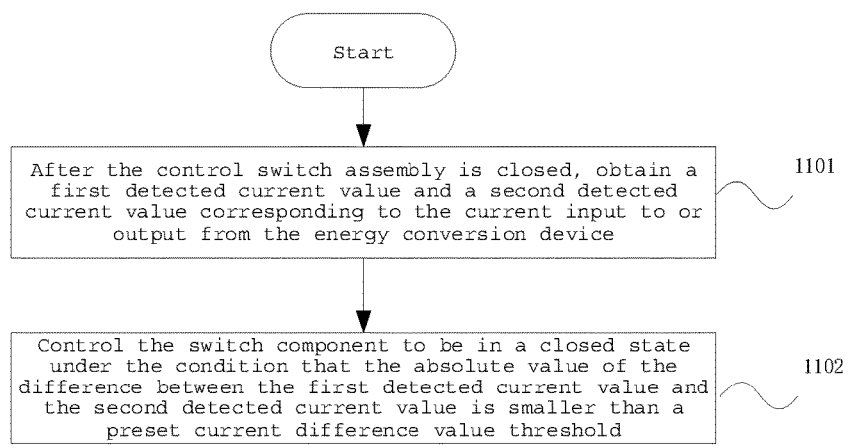
FIG. 11 is a schematic flowchart illustrating an anomaly judgement in some embodiments of the energy conversion method of the present disclosure.

The control device further includes a first current collecting circuit configured to collect a first detected current value corresponding to the current transmitted through the first connecting line. FIG. 11 is a schematic flowchart of the abnormality determination according to some embodiments of the energy conversion method of the present disclosure, as shown in FIG. 11:

in step 1101, after the control switch assembly is closed, a first detected current value and a second detected current value corresponding to the current input to or output from the energy conversion device are obtained.

in step 1102, the switch component is controlled to be in a closed state under the condition that the absolute value of the difference between the first detected current value and the second detected current value is smaller than a preset current difference value threshold.

In some embodiments, the energy conversion device comprises a second connecting line configured to receive electric energy input by the energy storage device or output electric energy to the energy storage device, an auxiliary power module, and a current limiting circuit arranged in the second connecting line; the current limiting circuit limits current passing through the second connecting line, so that the current limited is input into the auxiliary power supply module to supply power for the energy conversion device.

The current limiting circuit comprises a current limiting resistor and a third switching unit connected r in parallel with the current limiting resistor. When the energy conversion device is in the working state, the energy conversion device closes the third switch unit to short-circuit the current limiting resistor.

In some embodiments, the present disclosure further provides a computer-readable storage medium having stored thereon computer instructions, which, when executed by a processor, implement the method of energy conversion as in any of the above embodiments.

The present disclosure is described with reference to flowchart illustrations and/or block diagrams of methods, devices (systems) and computer program products according to embodiments of the disclosure. It will be understood that each flow and/or block of the flowchart illustrations and/or block diagrams, and combinations of flows and/or blocks in the flowchart illustrations and/or block diagrams, can be implemented by computer program instructions. These computer program instructions may be provided to a processor of a general purpose computer, special purpose computer, embedded processor, or other programmable data processing apparatus to produce a machine, such that the instructions, which execute via the processor of the computer or other programmable data processing apparatus, create means for implementing the functions specified in the flowchart flow or flows and/or block diagram block or blocks.

These computer program instructions may also be stored in a computer-readable memory that can direct a computer or other programmable data processing apparatus to function in a particular manner, such that the instructions stored in the computer-readable memory produce an article of manufacture including instruction means which implement the function specified in the flowchart flow or flows and/or block diagram block or blocks.

The control device, the energy conversion system, the energy conversion method, and the storage medium in the above embodiments detect voltages between the energy storage device and the energy conversion device and between the anode and the cathode of the energy storage device, calculate a resistance value corresponding to the energy conversion device based on the voltages, and control whether the energy storage device supplies power to the electrical apparatus through the energy conversion device according to the resistance value; the problem that the energy storage device is short-circuited due to short-circuit faults of an external device can be avoided, the energy storage device can be protected, whether faults exist in the energy conversion device and a circuit or not can be further confirmed through comparison of input or output current values of the energy storage device and the energy conversion device, safety and reliability are improved, and using experience of a user can be improved.

The method and system of the present disclosure may be implemented in a number of ways. For example, the methods and systems of the present disclosure may be implemented in software, hardware, firmware, or any combination of software, hardware, and firmware. The above-described order for the steps of the method is for illustration only, and the steps of the method of the present disclosure are not limited to the order specifically described above unless specifically stated otherwise. Further, in some embodiments, the present disclosure may also be embodied as programs recorded in a recording medium, the programs including machine-readable instructions for implementing the methods according to the present disclosure. Thus, the present disclosure also covers a recording medium storing a program for executing the method according to the present disclosure.

The description of the present disclosure has been presented for purposes of illustration and description, and is not intended to be exhaustive or limited to the disclosure in the form disclosed. Many modifications and variations will be apparent to practitioners skilled in this art. The embodiment was chosen and described in order to best explain the principles of the disclosure and the practical application, and to enable others of ordinary skill in the art to understand the disclosure for various embodiments with various modifications as are suited to particular use.

What is claimed is:

1. A control device, comprising:
 a detection unit configured to detect a first voltage between a positive electrode of the energy storage device and a first end of an energy conversion device, a second voltage between a negative electrode of the energy storage device and a second end of the energy conversion device, and a third voltage between the positive electrode and the negative electrode of the energy storage device; and
 a processing unit configured to calculate a resistance value corresponding to the energy conversion device according to the first voltage, the second voltage, and the third voltage; and controlling the energy storage device to supply power to the electrical equipment through the energy conversion device in case that the value of resistance is greater than a resistance threshold value.

2. The control device according to claim 1, wherein the processing unit is further configured to prohibit the energy storage device from providing power to an electrical equipment through the energy conversion device in case that the resistance value is less than or equal to the resistance threshold value.

3. A control device according to claim 1, wherein the energy storage means is connected to the energy conversion device via a first connection line in which a switch assembly is arranged, and the processing unit is further configured to:

close the switch assembly to enable the first connection line to be in a closed state under the condition that the resistance value is greater than the resistance threshold value, and disconnect the switch assembly so that the first connection line is in a disconnected state under the condition that the resistance value is less than or equal to the resistance threshold value.

4. The control device according to claim 3, wherein:

the detection unit comprises a fault detection circuit connected to the first connecting line, and the first connecting line and the fault detection circuit form a connection circuit between the energy storage device and the energy conversion device in case that the first connecting line is in a disconnected state; and the processing unit is further configured to calculate the resistance value from the first voltage, the second voltage, and the third voltage detected by the fault detection circuit and resistance information of the fault detection circuit.

5. The control device according to claim 4, wherein:

the first connecting line comprises a first line for connecting the positive electrode of the energy storage device and the first end of the energy conversion device, and a second line for connecting the negative electrode of the energy storage device and the second end of the energy conversion device;

the switch assembly comprises a first switch unit and a second switch unit which are respectively arranged on the first circuit and the second circuit; and the fault detection circuit comprises a first sampling circuit, a second sampling circuit and a third sampling circuit, which are respectively connected with the first line and the second line, and respectively detect a first voltage, a second voltage and a third voltage in case that the first switching unit and the second switching unit are in a disconnected state.

6. The control device according to claim 5, wherein:

a connection point of the first end of the first sampling circuit and the first line is located between the first switch unit and the energy conversion device, and a connection point of the second end of the first sampling circuit and the second line is located between the second switch unit and the energy storage device, the first sampling circuit is configured to acquire a first sampling voltage through a first sampling point provided in the first sampling circuit;

the connection point of the first end of the second sampling circuit and the first line is positioned between the first switch unit and the energy storage device, and the connection point of the second end of the second sampling circuit and the second line is positioned between the second switch unit and the energy conversion device, the second sampling circuit is configured to collect a second sampling voltage through a second sampling point provided in the second sampling circuit;

the connection point of the first end of the third sampling circuit and the first line is positioned between the first switch unit and the energy storage device, and the connection point of the second end of the third sampling circuit and the second line is positioned between the second switch unit and the energy storage device, the third sampling circuit is configured to collect a third sampling voltage through a third sampling point provided in the third sampling circuit; and the processing unit is further configured to calculate a first voltage based on the first sampled voltage and resistance information of the first sampling circuit, calculate a second voltage based on the second sampled voltage and resistance information of the second sampling circuit, and calculate a third voltage based on the third sampled voltage and resistance information of the third sampling circuit.

7. The control device according to claim 3, further comprising:

a first current collecting circuit configured to collect a first detected current value corresponding to a current transmitted through the first connection line, wherein the processing unit is further configured to acquire a first detected current value, a second detected current value corresponding to a current of the input or output energy conversion device after the control switch assembly is closed, and control the switch component to be in a closed state under the condition that the absolute value of the difference between the first detected current value and the second detected current value is smaller than a preset current difference value threshold value.

8. An energy conversion system, comprising:

an energy conversion device, an energy storage means and a control device according to claim 1.

9. The energy conversion system according to claim 8, wherein the energy conversion device comprises:

a second current collecting unit configured to collect a second detected current value corresponding to a current of the input or output energy conversion device; and a communication module configured to transmit the second detected current value to a processing unit of the control device.

10. The energy conversion system according to claim 8, wherein the energy conversion device comprises:

a second connecting line configured to receive the electric energy input by the energy storage device or output the electric energy to the energy storage device;

an auxiliary power supply module; and a current limiting circuit arranged in the second connecting circuit and configured to limit the current transmitted from the second connecting circuit, so that the limited current input into the auxiliary power supply module to supply power for the energy conversion device.

11. The energy conversion system of claim 10, wherein the current limiting circuit comprises:

a current limiting resistor; and a third switching unit connected with the current limiting resistor in parallel, and be closed by the energy conversion device to carry out short circuit on the current limiting resistor in case that the energy conversion device is in a working state.

12. An energy conversion method applied to an energy conversion system, the energy conversion system comprising: an energy conversion device, an energy storage device and a control device, wherein the control device comprises a detection unit and a processing unit; the detection unit is used for detecting a first voltage between the positive electrode of the energy storage device and the first end of the energy conversion device, a second voltage between the negative electrode of the energy storage device and the second end of the energy conversion device and a third voltage between the positive electrode and the negative electrode of the energy storage device; and the energy conversion method is executed in a processing unit and comprises:

calculating a resistance value corresponding to the energy conversion device according to the first voltage, the second voltage and the third voltage; and controlling the energy storage device to supply power to the electrical equipment through the energy conversion device when the resistance value is greater than the resistance threshold value.

13. The energy conversion method of claim 12, further comprising:

prohibiting the energy storage device from supplying power to the electrical equipment through the energy conversion device when the resistance value is less than or equal to the resistance threshold value.

14. The energy conversion method according to claim 12, wherein the energy storage device is connected to the energy conversion device through a first connection line, in which the switching assembly is disposed; and that controlling the energy storage device to supply power to the electrical equipment through the energy conversion device when the resistance value is greater than the resistance threshold value comprises:

closing the switch assembly so that the first connecting line is in a closed state when the resistance value is larger than the resistance threshold value;

wherein that prohibiting the energy storage device from supplying power to the electrical equipment through the energy conversion device when the resistance value is less than or equal to the resistance threshold value comprises:

turning off the switch component so that the first connecting circuit is in a disconnected state when the resistance value is less than or equal to the resistance threshold value.

15. The energy conversion method of claim 14, wherein the detection unit comprises: a fault detection circuit connected to the first connecting line; the first connecting line and the fault detection circuit form a connection circuit between the energy storage device and the energy conversion device when the first connecting line is in a disconnected state; and that calculating a resistance value corresponding to the energy conversion device according to the first voltage, the second voltage, and the third voltage comprises:

calculating the resistance value according to the first voltage, the second voltage and the third voltage detected by the fault detection circuit and the resistance information of the fault detection circuit.

16. The energy conversion method of claim 15, wherein the first connecting line comprises: a first line for connecting a positive electrode of the energy storage device and a first end of the energy conversion device, and a second line for connecting the positive electrode of the energy storage device and to second end of the energy conversion device; the switch assembly comprises a first switch unit and a second switch unit which are respectively arranged on the first line and the second line; the fault detection circuit comprises a first sampling circuit, a second sampling circuit and a third sampling circuit which are respectively connected with the first line and the second line; and the energy conversion method further comprises:

when the first switch unit and the second switch unit are in a disconnected state, calculating a first voltage according to a first sampling voltage acquired by the first sampling circuit and resistance information of the first sampling circuit, calculating a second voltage according to a second sampling voltage acquired by the second sampling circuit and resistance information of the second sampling circuit, and calculating a third voltage according to a third sampling voltage acquired by the third sampling circuit and resistance information of the third sampling circuit.

17. The energy conversion method of claim 14, wherein the control device further comprises a first current collecting circuit configured to collect a first detected current value corresponding to a current transmitted through the first connection line, and the energy conversion method further comprises:

acquiring the first detected current value, a second detected current value corresponding to the current input into the energy conversion equipment or the current output by the energy conversion equipment after the control switch assembly is closed; and controlling the switch assembly to be in a closed state under the condition that the absolute value of the difference between the first detected current value and the second detected current value is smaller than a preset current difference value threshold value.

18. The energy conversion method according to claim 14, wherein:

the energy conversion device comprises a second connecting line configured to receive electric energy input by the energy storage device or output electric energy to the energy storage device, an auxiliary power module and a current limiting circuit arranged in the second connecting line; and the current limiting circuit limits current passing through the second connecting circuit, so that the current limited is input into the auxiliary power supply module to supply power for the energy conversion device.

19. The energy conversion method of claim 18, wherein:

the current limiting circuit comprises a current limiting resistor and a third switch unit connected in parallel with the current limiting resistor; and the energy conversion device closes the third switch unit to short-circuit the current limiting resistor when the energy conversion device is in the working state.

20. A non-transient computer-readable storage medium having stored thereon computer program instructions which, when executed by one or more processors, implement the steps of the energy conversion method according to claim 12.

* * * * *